United States Patent
Grötsch et al.

(10) Patent No.: US 8,373,186 B2
(45) Date of Patent: Feb. 12, 2013

(54) RADIATION-EMITTING COMPONENT

(75) Inventors: Stefan Grötsch, Lengfeld-Bad Abbach (DE); Jan Marfeld, Regensburg (DE); Jörg Erich Sorg, Regensburg (DE); Moritz Engl, Regensburg (DE); Steffen Köhler, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 268 days.

(21) Appl. No.: 12/677,320

(22) PCT Filed: Aug. 28, 2008

(86) PCT No.: PCT/DE2008/001448
§ 371 (c)(1),
(2), (4) Date: Mar. 10, 2010

(87) PCT Pub. No.: WO2009/036731
PCT Pub. Date: Mar. 26, 2009

(65) Prior Publication Data
US 2010/0207148 A1 Aug. 19, 2010

(30) Foreign Application Priority Data
Sep. 21, 2007 (DE) .......................... 10 2007 045 087
Jan. 21, 2008 (DE) .......................... 10 2008 005 344

(51) Int. Cl.
*H01L 33/58* (2010.01)
(52) U.S. Cl. ................................. 257/98; 257/E33.068
(58) Field of Classification Search .................... 257/68, 257/E33.068, 98
See application file for complete search history.

(56) References Cited

U.S. PATENT DOCUMENTS

| 6,455,878 B1 | 9/2002 | Bhat et al. |
| 2003/0025212 A1 | 2/2003 | Bhat et al. |
| 2004/0113549 A1* | 6/2004 | Roberts et al. ................ 313/512 |
| 2006/0071223 A1 | 4/2006 | Richter et al. |
| 2006/0145172 A1 | 7/2006 | Su et al. |

(Continued)

FOREIGN PATENT DOCUMENTS

| EP | 1 577 956 A1 | 9/2005 |
| EP | 1 816 687 A2 | 8/2007 |

(Continued)

OTHER PUBLICATIONS

Frank L. Pedrotti, S.J. et al., "Introduction to Optics, Chapter 19: Optics of the Eye," 1993.

(Continued)

*Primary Examiner* — Matthew C. Landau
*Assistant Examiner* — Colleen E Snow
(74) *Attorney, Agent, or Firm* — DLA Piper LLP (US)

(57) ABSTRACT

A radiation-emitting component includes a semiconductor layer stack having an active region that emits electromagnetic radiation, and at least one surface of the semiconductor layer stack or of an optical element that transmits the electromagnetic radiation wherein the surface has a normal vector, wherein on the at least one surface of the semiconductor layer stack or of the optical element through which the electromagnetic radiation passes, an antireflection layer is arranged such that, for a predetermined wavelength, it has a minimum reflection at a viewing angle relative to the normal vector of the surface at which an increase in a zonal luminous flux of the electromagnetic radiation has approximately a maximum.

4 Claims, 6 Drawing Sheets

U.S. PATENT DOCUMENTS

| | | |
|---|---|---|
| 2006/0197096 A1 | 9/2006 | Kerdiles et al. |
| 2006/0208268 A1 | 9/2006 | Ueno et al. |
| 2007/0091436 A1* | 4/2007 | Aoki et al. .................. 359/460 |

FOREIGN PATENT DOCUMENTS

| | | |
|---|---|---|
| FR | 2 861 853 A1 | 5/2005 |
| JP | 11-145519 A | 5/1999 |
| JP | 2006-93602 A | 4/2006 |
| JP | 2006-261540 A | 9/2006 |
| JP | 2006-352085 A | 12/2006 |
| WO | 2004/059750 A1 | 7/2004 |
| WO | 2004/100278 A2 | 11/2004 |
| WO | 2006/040704 A1 | 4/2006 |

OTHER PUBLICATIONS

Frank L. Pedrotti, S.J. et al., "Introduction to Optics, Chapter 20: Aberration Theory," 1993.

Frank L. Pedrotti, S.J. et al., "Introduction to Optics, Chapter 22: Theory of Multilayer Films," 1993.

Frank L. Pedrotti, S.J. et al., "Introduction to Optics, Chapter 23: Fresnel Equations," 1993.

* cited by examiner

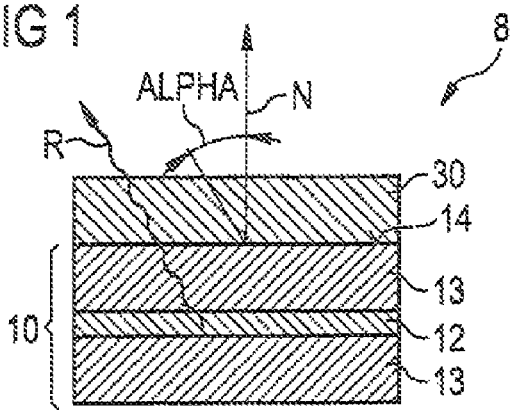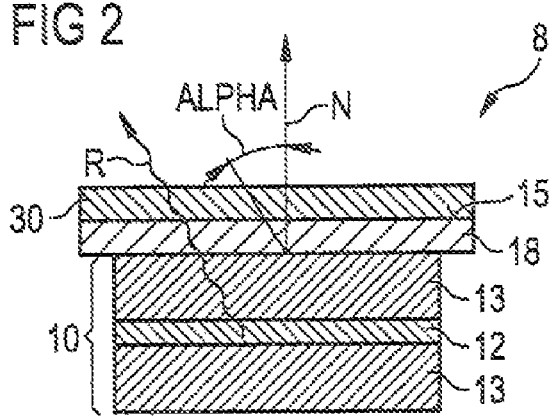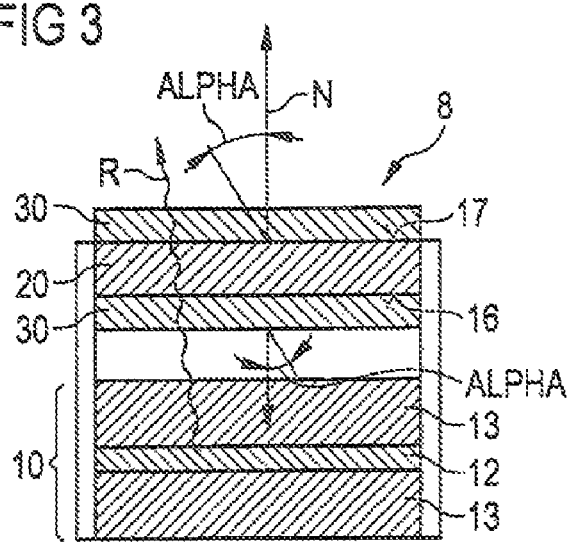

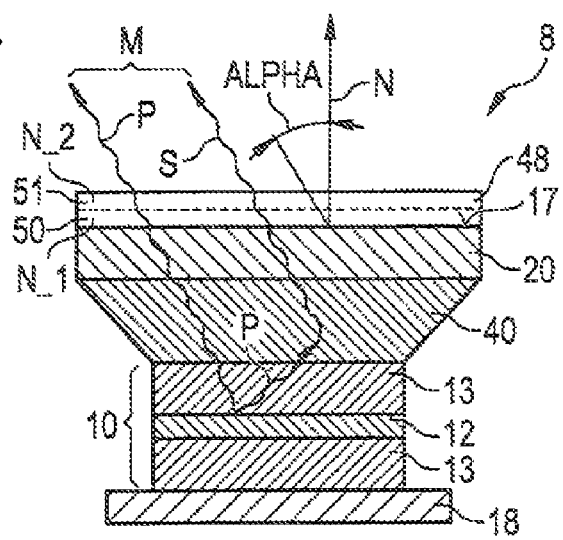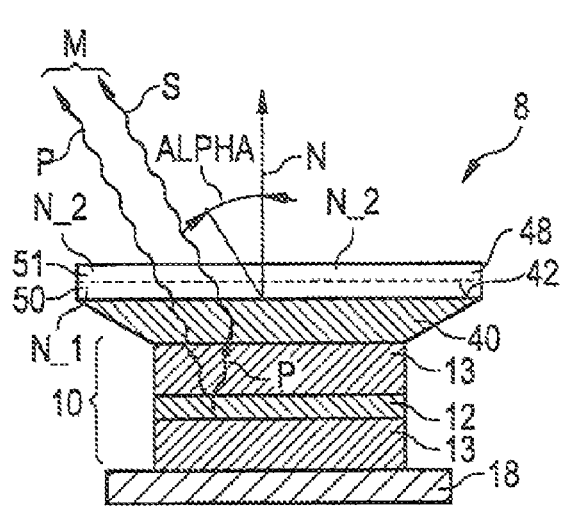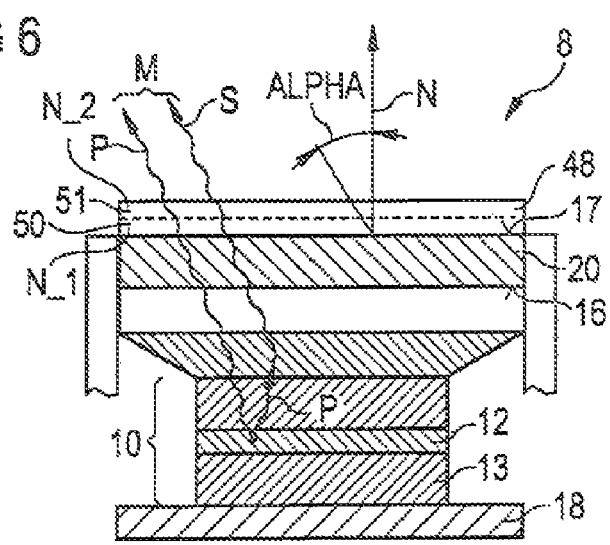

VII-VIII'

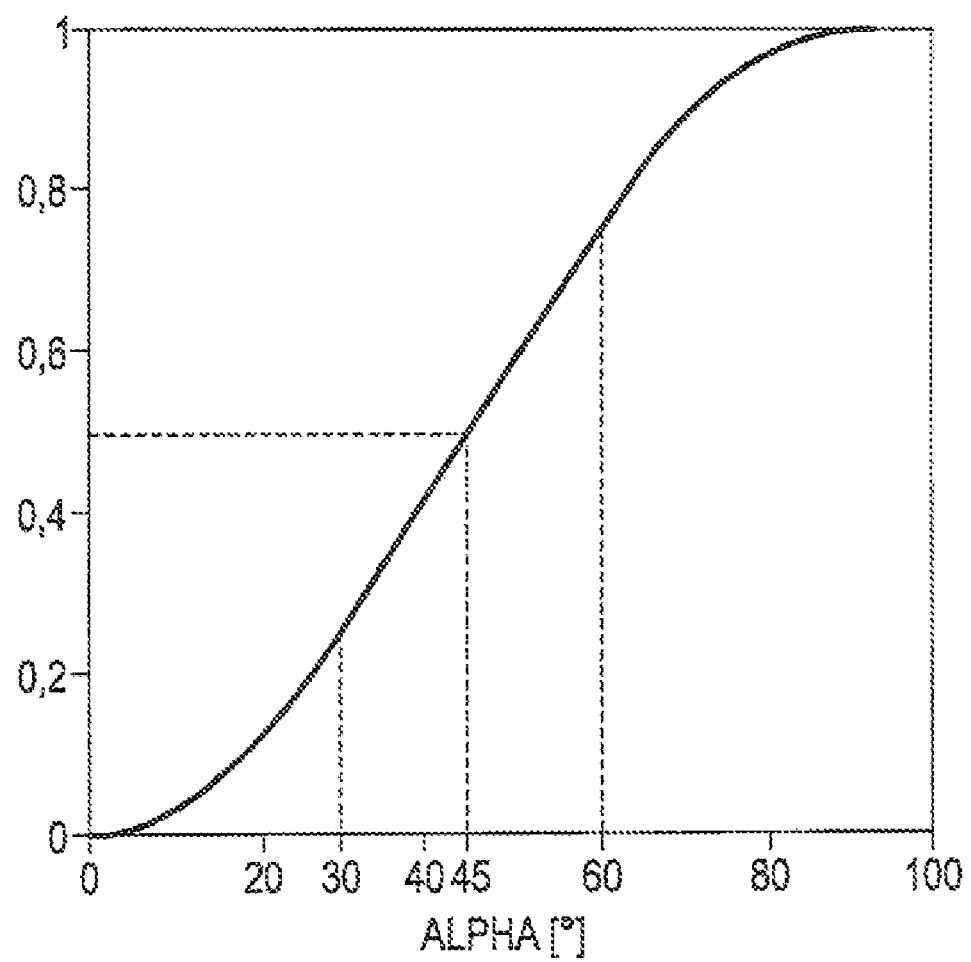

RADIATION-EMITTING COMPONENT

RELATED APPLICATIONS

This is a §371 of International Application No. PCT/DE2008/001448, with an international filing date of Aug. 28, 2008 (WO 2009/036731 A2, published Mar. 26, 2009), which is based on German Patent Application Nos. 10 2007 045 087.9, filed Sep. 21, 2007, and 10 2008 005 344.9, filed Jan. 21, 2008, the subject matter of which is incorporated by reference.

TECHNICAL FIELD

This disclosure relates to a radiation-emitting component comprising an active region embodied for the emission of electromagnetic radiation.

BACKGROUND

It could be helpful to provide a radiation-emitting component which enables a high radiation emission efficiency of the radiation-emitting component in a simple manner. Moreover, it could be helpful to realize a desired radiation spectrum with a high accuracy in a simple manner.

SUMMARY

We provide a radiation-emitting component including a semiconductor layer stack having an active region that emits electromagnetic radiation, and at least one surface of the semiconductor layer stack or of an optical element that transmits the electromagnetic radiation wherein the surface has a normal vector, wherein on the at least one surface of the semiconductor layer stack or of the optical element through which the electromagnetic radiation passes, an antireflection layer is arranged such that, for a predetermined wavelength, it has a minimum reflection at a viewing angle relative to the normal vector of the surface at which an increase in a zonal luminous flux of the electromagnetic radiation has approximately a maximum.

We also provide a radiation-emitting component including a semiconductor layer stack having an active region that emits electromagnetic primary radiation, and a converter layer mechanically coupled to the semiconductor layer stack and comprising a phosphor that converts part of the electromagnetic primary radiation into an electromagnet secondary radiation, wherein part of the electromagnetic primary radiation is superposed with part of the electromagnetic secondary radiation to form a mixed radiation having a resultant point in color space, and a color correction layer having at least two layers arranged adjacent at least one of the surfaces through which the electromagnetic mixed radiation passes, wherein a first layer consists of a material having a first refractive index and a second layer consists of a material having a second refractive index, the first refractive index is different from the second refractive index, and the layers set the resultant point in color space depending on a viewing angle.

We further provide a radiation-emitting component including a semiconductor layer stack having an active region that emits electromagnetic radiation, and a covering element having a surface wherein an absorbent or reflective layer is arranged on the surface in a first section of the covering element and in a second section of the covering element the surface is free of the absorbent or reflective layer.

We further yet provide a radiation-emitting component including a semiconductor layer stack having an active region that emits electromagnetic radiation, and a covering element having a surface wherein an absorbent or reflective layer is arranged on the surface in a first section of the covering element and in a second section of the covering element the surface is free of the absorbent or reflective layer, wherein the electromagnetic radiation is an electromagnetic primary radiation, and includes a converter layer which is mechanically coupled to the semiconductor layer stack, and has a phosphor that converts part of the electromagnetic primary radiation into an electromagnetic secondary radiation, wherein part of the electromagnetic primary radiation is superposed with part of the electromagnetic secondary radiation to form a mixed radiation having a resultant point in color space, and wherein a color correction layer having at least two adjacent layers is arranged on the second section of the covering element wherein a first layer consists of a material having a first refractive index and a second layer consists of a material having a second refractive index, the first refractive index is different from the second refractive index, and the layers set the resultant point in color space depending on the viewing angle relative to the normal vector of the surface.

BRIEF DESCRIPTION OF THE DRAWINGS

Advantageous configurations are explained in more detail below with reference to the schematic drawings.

In the figures:

FIG. 1 shows a sectional view of a first example of a radiation-emitting device comprising an antireflection layer;

FIG. 2 shows a sectional view of a further example of the radiation-emitting device comprising an antireflection layer;

FIG. 3 shows a sectional view of a further example of a radiation-emitting device comprising an antireflection layer;

FIG. 4 shows a sectional view of a first example of a radiation-emitting device comprising a color correction layer;

FIG. 5 shows a sectional view of a further example of the radiation-emitting device comprising a color correction layer;

FIG. 6 shows a sectional view of a further example of a radiation-emitting device comprising a color correction layer;

FIG. 12 shows a profile of a zonal luminous flux of a light-emitting diode in normalized representation.

DETAILED DESCRIPTION

Figure 7A:
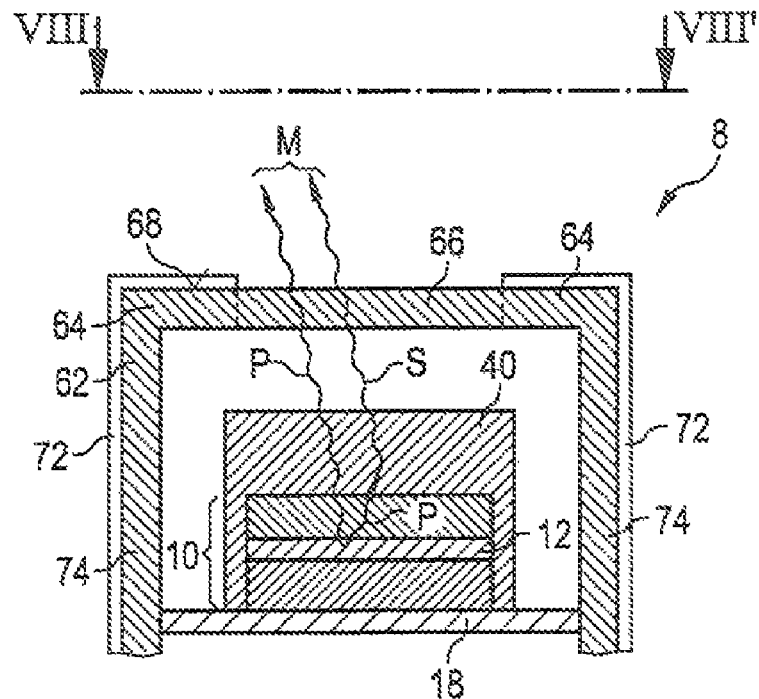
FIG. 7 shows a sectional view of an example of a radiation-emitting device.

A first aspect specifies a radiation-emitting component comprising a semiconductor layer stack having an active region embodied for the emission of electromagnetic radiation, and at least one surface of the semiconductor layer stack or of an optical element embodied for the transmission of the electromagnetic radiation wherein the surface has a normal vector, wherein on the at least one surface of the semiconductor layer stack or of the optical element through which the electromagnetic radiation passes, an antireflection layer is arranged and embodied in such a way that, for a predetermined wavelength it has a minimum reflection at a viewing angle relative to the normal vector of the surface at which the increase in a zonal luminous flux of the electromagnetic radiation has approximately a maximum. The zonal luminous flux is the luminous flux in a solid angle range over the surface of the semiconductor layer stack or over the surface of the optical element embodied for the transmission of the electromagnetic radiation, proceeding from the normal vector of the respective surface.

The zonal luminous flux in the solid angle range over the surface of the semiconductor layer stack or over the surface of the optical element embodied for the transmission of the electromagnetic radiation permits a statement with regard to the angle-dependent total emission of the radiation-emitting component. The advantage of an embodiment of the antireflection layer in such a way that, for a predetermined wavelength, it has a minimum reflection at a viewing angle relative to the normal vector of the surface at which the increase in a zonal luminous flux of the electromagnetic radiation has approximately a maximum is that it is thus possible to maximize the total emission for radiation-emitting components taking account of the profile of the zonal luminous flux of the electromagnetic radiation depending on the viewing angle.

In one example, the antireflection layer is embodied in such a way that, for the predetermined wavelength, it has a minimum reflection at the viewing angle relative to the normal vector of between 30° and 60°. Thus it is possible to maximize the total emission for radiation-emitting components in which the maximum of the increase in the zonal luminous flux of the electromagnetic radiation is at viewing angles of between 30° and 60°.

In a further preferred example, the antireflection layer is embodied in such a way that, for the predetermined wavelength, it has the minimum reflection at the viewing angle relative to the normal vector of between 40° and 50°. This makes it possible to maximize the total emission for radiation-emitting components in which the maximum of the increase in the zonal luminous flux of the electromagnetic radiation is at a viewing angle of approximately 45°.

In a further example, the radiation-emitting component has a substrate on which the semiconductor layer is arranged. The substrate has a surface which is remote from the semiconductor layer stack. On the surface the antireflection layer is arranged. This has the advantage that the antireflection layer can be applied simply to the existing substrate of the radiation-emitting component.

In a further example, the radiation-emitting component has a cover plate spaced apart from the semiconductor layer stack wherein the cover plate has a surface facing the semiconductor layer stack and a surface remote from the semiconductor layer stack and the antireflection layer is arranged on at least one of the surfaces of the cover plate. This means that the reflection layer can be applied in an advantageous manner independently of the production of the semiconductor layer stack. The reflection layer can be applied finally also to the already completed radiation-emitting component.

In a further example, the antireflection layer comprises a metal fluoride or a metal oxide and the metal is selected from the group consisting of hafnium, zirconium, aluminium, titanium and magnesium. This has the advantage that metal fluorides and metal oxides comprising metals of this type are very well suited to antireflection layers.

In a further example, the substrate comprises a material selected from the group of glass, quartz and plastic. This enables a stable, simple-to-produce and cost-effective solution for the substrate.

A second aspect specifies a radiation-emitting component comprising a semiconductor layer stack having an active region embodied for the emission of electromagnetic primary radiation, and a converter layer which is mechanically coupled to the semiconductor layer stack and comprises a phosphor embodied for the conversion of part of the electromagnetic primary radiation into an electromagnetic secondary radiation, wherein part of the electromagnetic primary radiation is superposed with part of the electromagnetic secondary radiation to form a mixed radiation having a resultant point (chromaticity coordinate) in color space, and a color correction layer having at least two layers arranged adjacent is arranged on at least one of the surfaces through which the electromagnetic mixed radiation passes, wherein a first layer consists of a material having a first refractive index and a second layer consists of a material having a second refractive index, the first refractive index is different from the second refractive index, and the layers are embodied for setting the resultant point in color space depending on a viewing angle.

This has the advantage that, taking account of the composition of the electromagnetic mixed radiation, it is possible to effect a highly differentiated influencing of the mixing ratio of primary and secondary radiation for radiation emitting components depending on the viewing angle. Furthermore, this has the advantage that electromagnetic radiation having a wavelength that is not intended to be emitted can be reflected back into the converter layer, where it can be converted into electromagnetic secondary radiation for further use.

In one example of the second aspect, the color correction layer is embodied as a layer stack having a multiplicity of layers, and the layers are arranged in such a way that the two layers respectively adjacent to one of the layers have refractive indices which are both either less than or greater than the refractive index of the respective one layer. This corresponds to an arrangement of a layer stack with layers having alternately a high and a low refractive index. Such an arrangement of the layers enables a broadband and highly effective color correction.

In a further example of the second aspect, the color correction layer is arranged on the converter layer. The color correction layer can thus be arranged in such a way that it is mechanically protected particularly well.

In a further example of the second aspect, the radiation-emitting component has a cover plate, which is arranged on the converter layer, and which has a surface which is remote from the converter layer and on which the color correction layer is arranged. This means that the color correction layer can be applied independently of the production of the layer stack and the converter layer. The reflection layer can be applied finally also to the cover plate of the already completed radiation-emitting component.

In a further example of the second aspect, the radiation-emitting component has a cover plate spaced apart from the converter layer, wherein the cover plate has a surface facing the semiconductor layer stack and a surface remote from the semiconductor layer stack and the color correction layer is arranged on at least one of the surfaces of the cover plate. This has the advantage that the color correction layer can be applied independently of the production of the layer stack and the converter layer. The reflection layer can be applied also finally to a separate cover plate of the otherwise already completed radiation-emitting component.

In a further example of the second aspect, the color correction layer comprises a metal fluoride or a metal oxide, and the metal is selected from the group consisting of magnesium, hafnium, zirconium, aluminium, and titanium. The layers of the color correction layer can be formed from different metal fluorides and metal oxides. Metal fluorides and metal oxides comprising metals of this type are very well suited to layers for color correction.

A third aspect specifies a radiation-emitting component comprising a semiconductor layer stack having an active region embodied for the emission of electromagnetic radiation and a covering element having a surface wherein an absorbent or reflective layer is arranged on the surface in a first section of the covering element and in a second section of the covering element the surface is free of the absorbent or reflective layer. This has the advantage that the radiation-emitting component comprising a semiconductor layer stack can emit a light beam having a cross-sectional form which is defined by the form of the second section of the covering element, the second section being embodied as a window region.

In one example of the third aspect, on one of the surfaces of the second section of the covering element, an antireflection layer is arranged and embodied in such a way that, for a predetermined wavelength, it has a minimum reflection at a viewing angle relative to a normal vector of the surface, at which the increase in a zonal luminous flux of the electromagnetic radiation has approximately a maximum. It is thus possible for the total emission for the radiation-emitting component, in the second section of the covering element, the second section being embodied as a window region, to assume a maximum taking account of the profile of the zonal luminous flux of the electromagnetic radiation depending on the viewing angle.

In a further example of the third aspect, the antireflection layer is embodied in such a way that, for the predetermined wavelength, it has a minimum reflection at the viewing angle of between 40° and 50°. This has the advantage that the total emission of the radiation-emitting component in which the maximum of the increase in the zonal luminous flux of the electromagnetic radiation is at a viewing angle of approximately 45° can assume a maximum.

In a further example of the third aspect, the antireflection layer comprises a metal fluoride or a metal oxide and the metal is selected from the group consisting of hafnium, zirconium, aluminium, titanium and magnesium. This is particularly advantageous since metal fluorides and metal oxides comprising metals of this type can be very well suited to antireflection layers.

In a further example of the third aspect, the electromagnetic radiation is an electromagnetic primary radiation, and comprising a converter layer, which is mechanically coupled to the layer stack, and has a phosphor embodied for the conversion of part of the electromagnetic primary radiation into an electromagnetic secondary radiation, wherein part of the electromagnetic primary radiation is superposed with part of the electromagnetic secondary radiation to form a mixed radiation having a resultant point in color space, and wherein a color correction layer having at least two layers arranged adjacent is arranged on the second section of the covering element wherein a first layer consists of a material having a first refractive index and a second layer consists of a material having a second refractive index, the first refractive index is different from the second refractive index, and the layers are embodied for setting the resultant point in color space depending on a viewing angle. This has the advantage that, taking account of the composition of the electromagnetic mixed radiation, it is possible to effect a highly differentiated influencing of the mixing ratio of primary and secondary radiation for radiation-emitting components depending on the viewing angle.

In a further example of the third aspect, the color correction layer comprises a metal fluoride or a metal oxide, and the metal is selected from the group consisting of magnesium, hafnium, zirconium, aluminium, and titanium. This is advantageous since metal fluorides and metal oxides comprising metals of this type are very well suited to layers for color correction.

In a further example of the third aspect, the color correction layer is embodied as a layer stack having a multiplicity of layers, and the layers are arranged in such a way that the two layers respectively adjacent to one of the layers have refractive indices which are both either less than or greater than the refractive index of the respective layer. This is advantageous since layer stacks having alternately high and low refractive indices enable a broadband and highly effective color correction.

In a further example of the third aspect, the antireflection layer and the color correction layer are arranged on two mutually oppositely arranged surfaces of the second section of the covering element. This has the advantage that the covering element can serve as a carrier both for the antireflection layer and for the color correction layer. Furthermore, this has the advantage that the antireflection layer can be applied to the covering element independently of the color correction layer.

In a further example, the radiation-emitting component is a light-emitting diode. It is thus possible to use the reflection layer and/or the color correction layer for light-emitting diodes.

In a further example, the radiation-emitting component is embodied in areal fashion. In this case, embodied in areal fashion can mean that the radiation-emitting component extends continuously over an area region that comprises at least an area of a plurality of square millimeters, preferably a plurality of square centimeters and with particular preference at least one or a plurality of square decimeters or more. This has the advantage that the reflection layer and/or the color correction layer can be embodied for radiation-emitting components embodied in areal fashion and thus also for very flat radiation-emitting components.

Turning now to the Drawings, elements of identical construction or function are identified by the same reference symbols throughout the figures.

The illustrated elements and their size relationships among one another should not be regarded as true to scale in principle; rather, individual elements such as, for example, layers, structural parts, components and regions may be illustrated with an exaggerated thickness or size dimensions for the sake of better representability and/or for the sake of better understanding.

FIG. 1 shows a first example of a radiation-emitting component 8.

The radiation-emitting component 8 has a semiconductor layer stack 10. The semiconductor layer stack 10 has an active region 12 embodied for the emission of electromagnetic radiation R.

Radiation-emitting components 8 of this type are preferably embodied in such a way that the radiation-emitting component 8 is a light-emitting diode or a light-emitting diode array.

Preferably, the radiation-emitting component 8 is a semiconductor light-emitting diode, for example based on AlInGaN.

Connecting regions 13 are arranged adjacent to the active region 12 and are coupled to connecting wires for supplying the radiation-emitting component 8 with electric current.

The semiconductor layer stack 10 is arranged on a substrate 18. It is particularly preferred for the substrate 18 to comprise glass. As an alternative or in addition, the substrate 18 also can comprise quartz, plastic films, metal, metal films, silicon wafers or any other suitable substrate material. As an alternative or in addition, the substrate 18 can also comprise a laminate or a layer sequence composed of a plurality of layers. In this case, at least one of the layers can comprise glass or be composed of glass. In particular, in the case of a substrate 18 formed from a layer sequence, at least the layer on which the semiconductor layer stack 10 is arranged can comprise glass. Furthermore, the substrate 18 can also comprise plastic.

If the radiation-emitting component 8 is embodied in such a way that the electromagnetic radiation R emitted in the active region 12 is radiated through the substrate 18 (FIG. 2), then the substrate 18 advantageously can have a transparency to at least part of the electromagnetic radiation generated in the active region 12. In this configuration, the connecting region 13 formed between the active region 12 and the substrate 18 can also advantageously have a transparency at least to part of the electromagnetic radiation generated in the active region 12.

The semiconductor layer stack 10 has a surface 14 having a normal vector N with an antireflection layer 30 arranged on the surface (FIG. 1). Antireflection layer 30 is embodied in such a way that, for a predetermined wavelength, it has a minimum reflection at a viewing angle ALPHA relative to the normal vector N of the surface 14 of the semiconductor layer stack 10 at which the increase in a zonal luminous flux of the electromagnetic radiation R approximately has a maximum.

The profile of the zonal luminous flux is illustrated in normalized form by way of example for a light-emitting diode in FIG. 12.

The profile is illustrated as a function of a solid angle range between 0° and the viewing angle ALPHA. The solid angle range is based in each case on the normal vector N and the viewing angle ALPHA can lie between 0° and 90°. In this case, the zonal luminous flux is normalized to the zonal luminous flux in a solid angle range of between 0° and 90°. In the example illustrated here of the radiation-emitting component 8 as a light-emitting diode, the maximum rise in the zonal luminous flux is achieved for a value of the viewing angle ALPHA equal to 45°. To put it another way, this means the highest differential contribution to the total emission of the light-emitting diode is at a solid angle for which the viewing angle ALPHA is equal to 45°.

The antireflection layer 30 need not necessarily be embodied in such a way that, for the predetermined wavelength, the reflection is minimal precisely at the viewing angle ALPHA relative to the normal vector N of the surface 14, since the increase in the zonal luminous flux of the electromagnetic radiation R is generally approximately constant in a wide range around the maximum of the increase in the zonal luminous flux of the electromagnetic radiation R. It suffices, therefore, if the antireflection layer 30 is embodied in such a way that, for the predetermined wavelength, the minimum reflection is at a viewing angle ALPHA relative to the normal vector N of the surface 14 in the vicinity of the maximum of the increase in the zonal luminous flux of the electromagnetic radiation R.

It is particularly preferred if, for the predetermined wavelength, the minimum reflection of the antireflection layer 30 is at the viewing angle ALPHA relative to the normal vector N of between 30° and 60°. It is thus possible to achieve, for radiation-emitting components 8 a maximization of the total emission for which the maximum of the zonal luminous flux of the electromagnetic radiation R is at viewing angles ALPHA of between 30° and 60°.

It is particularly preferred, in particular, if the minimum reflection of the antireflection layer 30 for the predetermined wavelength lies in a range of the viewing angle ALPHA of between 40° and 50°.

In a further example, the substrate 18 has a surface 15 remote from the semiconductor layer stack 10 (FIG. 2). The antireflection layer 30 is arranged on the surface 15 of the substrate 18 that is remote from the semiconductor layer stack 10. The function of the antireflection layer 30 of the example in FIG. 2 corresponds to the function of the antireflection layer 30 of the example in FIG. 1.

FIG. 3 shows the radiation-emitting component comprising the semiconductor layer stack 10 and a cover plate 20 spaced apart from the semiconductor layer stack 10, the cover plate having a surface 16 facing the semiconductor layer stack 10 and a surface 17 remote from the semiconductor layer stack 10. To achieve a reduction of the reflection at the cover plate 20 embodied as an optical element suitable for the transmission of the electromagnetic radiation R, the antireflection layer 30 is arranged both on the surface 16 facing the semiconductor layer stack 10 and on the surface 17 of the cover plate 20 that is remote from the semiconductor layer stack 10. What can thus be achieved is that a minimum reflection is achieved for a predetermined wavelength at a viewing angle ALPHA relative to the normal vector N of the surfaces 16, 17 at which the increase in the zonal luminous flux of the electromagnetic radiation R has a maximum. This is particularly advantageous since it is thus possible to achieve the minimization of the reflection on both surfaces 16, 17 of the cover plate.

The antireflection layer 30 on one or more of the surfaces 14, 15, 16, 17 is implemented by vapor deposition of one or more thin layers of a material, in particular, of a metal fluoride or of a metal oxide. The metal of the metal fluoride and/or of the metal oxide is preferably selected from the group consisting of hafnium, zirconium, aluminium, titanium and magnesium. Suitable materials are, in particular, magnesium fluoride, silicon dioxide, titanium dioxide or zirconium dioxide.

It is particularly preferred if the antireflection layer 30 has a plurality of layers. This has the advantage that the reflection can thereby be greatly minimized. Furthermore, as a result of the antireflection layer 30 being embodied from a plurality of layers, it is possible to achieve a reduction of the reflection for a plurality of wavelengths.

In further examples, the radiation-emitting component 8 is preferably embodied as a light-emitting diode that emits a mixed light, that is to say electromagnetic radiation from at least two wavelength ranges (FIGS. 4 to 6). Such radiation-emitting components 8 are particularly preferably embodied as white-light light-emitting diodes.

FIGS. 4 to 6 show the radiation-emitting component 8 comprising the semiconductor layer stack 10 and the active region 12 embodied for the emission of an electromagnetic primary radiation P. The radiation-emitting component 8 has a converter layer 40, which is mechanically coupled to the semiconductor layer stack 10.

The electromagnetic primary radiation P generated upon application of a current in the forward direction in the active region 12 of the radiation-emitting component 8 can have, in particular, a spectrum having wavelengths in an ultraviolet to infrared spectral range. In particular, it may be advantageous for the spectrum to comprise at least one wavelength which is visible to an observer. The spectrum of the electromagnetic radiation can advantageously also comprise a plurality of wavelengths, such that a mixed-colored luminous impression can arise for a viewer. For this purpose, it may be possible that the radiation-emitting component 8 itself can generate electromagnetic primary radiation P having a plurality of wavelengths, or that part of the electromagnetic primary radiation P generated by the radiation-emitting component 8 or the entire electromagnetic primary radiation P generated by the radiation-emitting component 8 and having a first wavelength, for instance in a blue and/or green spectral range, is converted by a wavelength conversion substance into an electromagnetic secondary radiation S having a second wavelength, for instance in a yellow and/or red spectral range. For this purpose, the converter layer 40 comprising the wavelength conversion substance is disposed downstream of the active region 12. Suitable wavelength conversion substances and layers comprising wavelength conversion substances are known to the person skilled in the art with regard to their construction and their function and are not explained in greater detail at this point. Part of the electromagnetic primary radiation P is superposed with part of the electromagnetic secondary radiation S to form an electromagnetic mixed radiation M having a resultant point in color space. For white-light light-emitting diodes, the electromagnetic mixed radiation M is substantially white light. It is desirable for a white-light light-emitting diode of this type to convey a color impression that is as homogeneous as possible areally.

Figure 10:
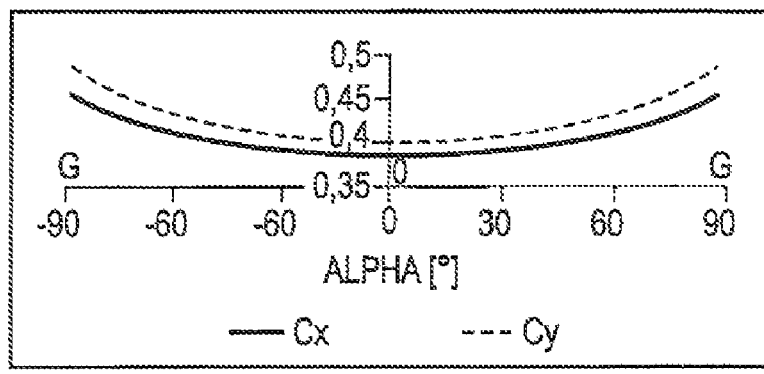
FIG. 10 shows chromaticity coordinates of a radiation-emitting device in accordance with a CIE chromaticity diagram as a function of a viewing angle.

As illustrated in FIG. 10, the chromaticity coordinates $C_x$ and $C_y$ of the electromagnetic mixed radiation M increase as the viewing angle ALPHA increases. This means that the proportion of electro magnetic secondary radiation S having the second wavelength in the yellow and/or red spectral range in the electromagnetic mixed radiation M increases as the viewing angle ALPHA increases.

Figure 11:
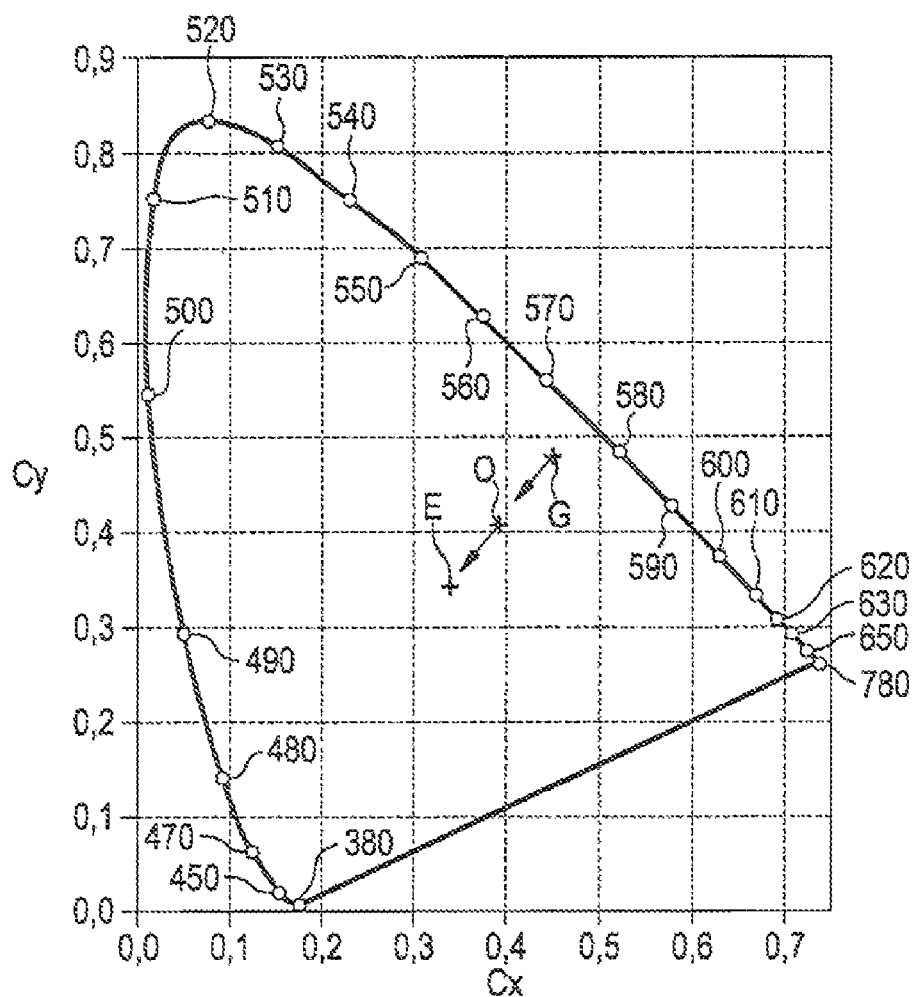
FIG. 11 shows the CIE chromaticity diagram with selected points in color space.

FIG. 11 shows a CIE chromaticity diagram with points in color space or the chromaticity coordinates $C_x$ and $C_y$ of the electromagnetic mixed radiation M. The point in color space G of the electromagnetic mixed radiation M for a viewing angle ALPHA of 90° is entered, as is the point in color space O for a viewing angle ALPHA equal to 0°. The white point E corresponding to pure white light, is furthermore indicated in the CIE chromaticity diagram in FIG. 11.

In the examples shown in FIGS. 4 and 6, the cover plate 20 is arranged on the converter layer 40. The cover plate 20 has a surface 17 remote from the converter layer 40 with a color correction layer 48 arranged on the surface.

The color correction layer 48 has at least two layers 50, 51 arranged adjacent. The first layer 50 consists of a material having a first refractive index N_1, and the second layer 51 consists of a material having a second refractive index N_2. The first refractive index N_1 differs from the second refractive index N_2. The layers 50, 51 are embodied with regard to their refractive indices N_1, N_2 and their thicknesses in such a way that the resultant point in color space can be set depending on the viewing angle ALPHA. What can be achieved by a suitable choice of the refractive indices N_1, N_2 and the thicknesses of the layers 50, 51 is, in particular, that the point in color space G for the viewing angle ALPHA of 90° and the point in color space O for the viewing angle ALPHA equal to 0° move nearer to the point in color space E as is indicated by arrows in the CIE chromaticity diagram in FIG. 11.

Figure 9:
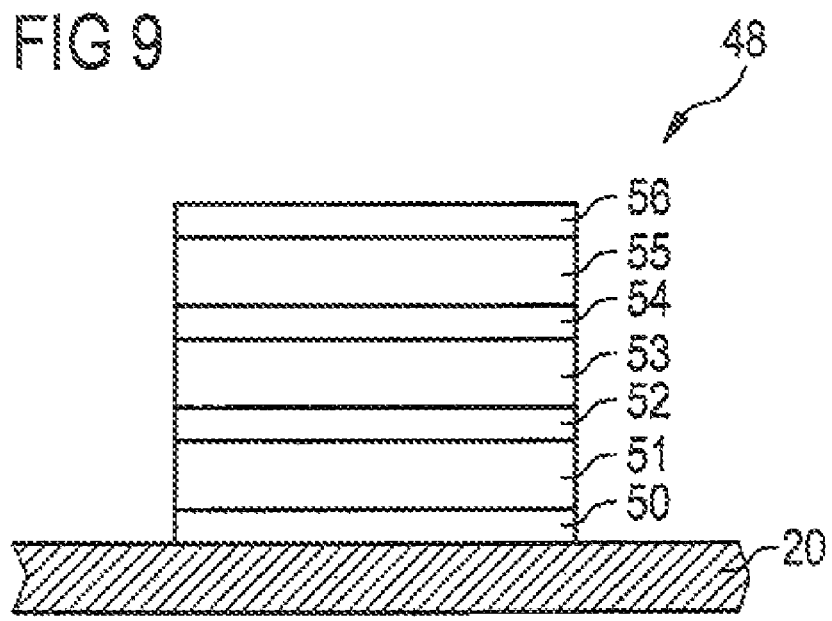
FIG. 9 shows a sectional view of a color correction layer of the radiation-emitting device.

If the color correction layer 48 is embodied as a layer stack having a multiplicity of layers 50, 51, 52, 53, 54, 55, 56, as is illustrated schematically in FIG. 9, and if the layers 50, 51, 52, 53, 54, 55, 56 are arranged in such a way that the two layers respectively adjacent to one of the layers have refractive indices which are both either less than or greater than the refractive index of the respective one layer; to put it another way this means that one of the layers of the color correction layer 48 respectively lies between adjacent layers which both have either a larger refractive index or a smaller refractive index; it is thus possible to achieve a particularly good color correction and hence a particularly extensive movement of the points in color space G, O to the point in color space E.

FIG. 5 illustrates an example of the radiation-emitting component 8 in which the color correction layer 48 is applied directly on a surface 42 of the converter layer 40.

FIG. 6 shows an example of the radiation-emitting component 8 in which the cover plate 20 is spaced apart from the converter layer 40. The color correction layer 48 is arranged on the surface 17 remote from the semiconductor layer stack 10. This has the advantage that the color correction layer 48 can also be applied subsequently to the cover plate 20. However, the color correction layer 48 can also be arranged additionally or solely on the surface 16 of the cover plate 20 that faces the semiconductor layer stack 10.

Figure 7B:
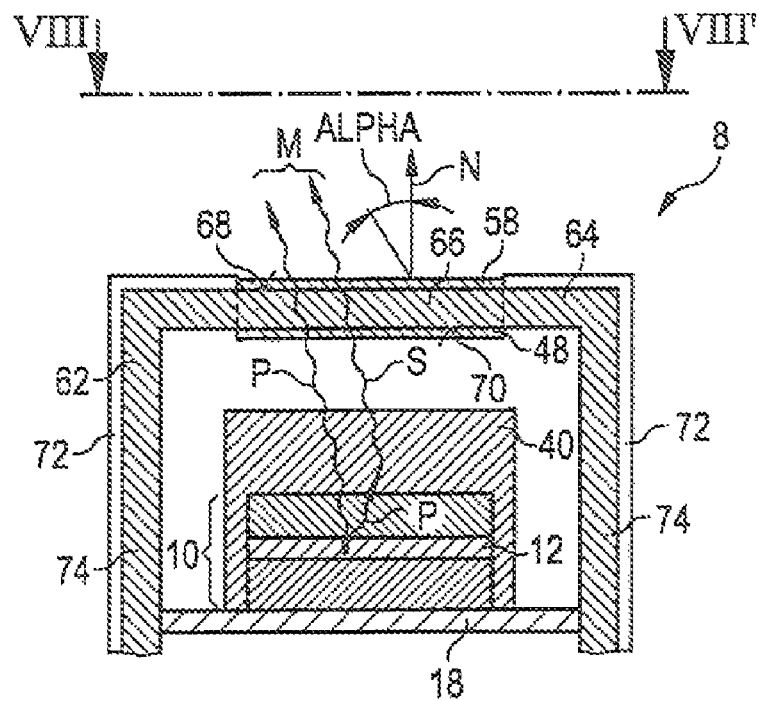

FIGS. 7a and 7b show examples of the radiation-emitting component 8 comprising the semiconductor layer stack 10 having the active region 12. The semiconductor layer stack 10 is embodied for the emission of electromagnetic primary radiation P. The radiation-emitting component 8 has the converter layer 40, which is mechanically coupled to the semiconductor layer stack 10. The converter layer 40 comprising a phosphor is embodied for the conversion of part of the electromagnetic primary radiation P into the electromagnetic secondary radiation S. Part of the electromagnetic primary radiation P and the electromagnetic secondary radiation S are superposed to form the mixed radiation M having the resultant point in color space.

The radiation-emitting component 8 has a covering element 62 having a first section 64 and a second section 66. The covering element 62 has an outer surface 68 and an inner surface 70. An absorbent or reflective layer 72 is arranged on the outer surface 68 of the first section 64 of the covering element 62. The surface 68, 70 of the second section 66 of the covering element 62 is free of the absorbent or reflective layer 72.

The reflective and/or absorbent layer 72 can in particular also be arranged on side sections 74 of the covering element 62. It is thus possible to avoid a transmission of light in particular in the side sections 74 of the covering element 62 and in parts of the front region of the first section 64 of the covering element 62 near the second section 66 of the covering element 62 (see FIG. 8).

Figure 8:
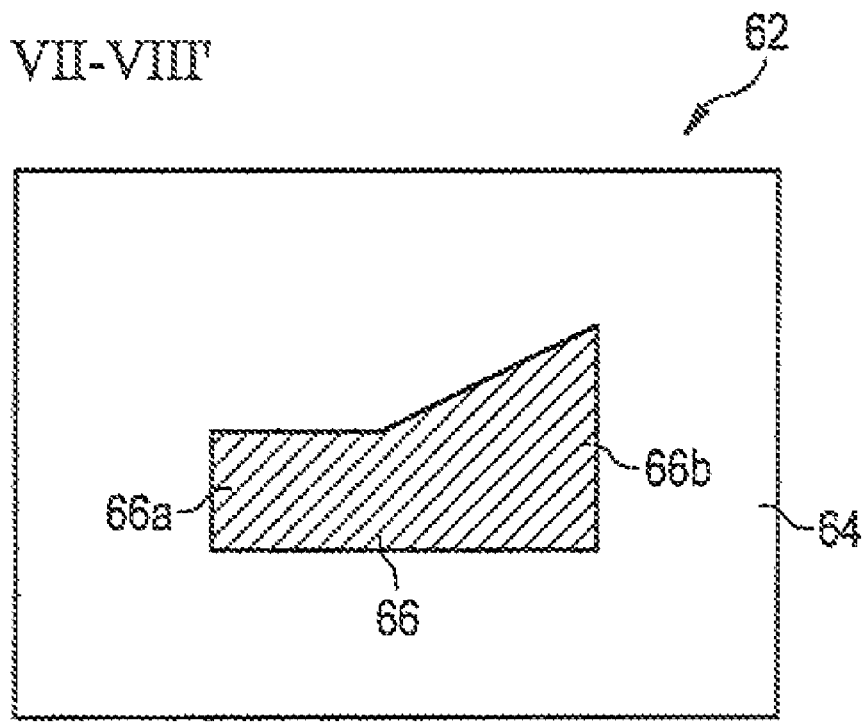
FIG. 8 shows a plan view of the further example of the radiation-emitting device along the line VIII-VIII' in FIG. 7.

The second section 66 of the covering element 62, which section is free of the absorbent and/or reflective layer 72, can have a suitable form, as is illustrated in FIG. 8. If the radiation-emitting component 8 is intended to be used, for example, for a headlight of a motor vehicle, then the light cone has a more or less abrupt dark/bright transition at the transition from the first section 64 to the second section 66. In particular, the second section 66 of the covering element 62 can have two partial sections 66a, 66b, the main extension directions of which are inclined with respect to one another in such a way that they form an angle of approximately 150° to 170° with one another. This is advantageous in particular if the second section 66 of the covering element 62 is intended to be used as a shutter element for a headlight of a motor vehicle and the shutter element is preferably intended to be used as asymmetrical dipped-beam headlamp.

FIG. 7b shows the radiation-emitting component 8, wherein an antireflection layer 58 is arranged on the surface 68 of the second section 66 of the covering element 62. The antireflection layer 58 is embodied in such a way that, for a predetermined wavelength, the radiation-emitting component 8 has a minimum reflection at a viewing angle ALPHA relative to the normal vector N of the surface 68, 70 at which the increase in the zonal luminous flux of the electromagnetic mixed radiation M approximately has a maximum. The antireflection layer 58 is preferably embodied in such a way that, for the predetermined wavelength, it has a minimum reflection at the viewing angle ALPHA of between 40 and 50°. It is particularly preferred if the antireflection layer 58 is formed from a metal fluoride or a metal oxide. The metal is preferably selected from the group consisting of hafnium, zirconium, aluminium, titanium and magnesium.

The color correction layer 48 is arranged on the surface 70 of the second section 66 of the covering element 62. The color correction layer 48 has at least two layers 50, 51 arranged adjacent. The first layer 50 consists of a material having a first refractive index N_1 and the second layer 51 consists of a material having a second refractive index N_2. The first refractive index N_1 is different from the second refractive index N_2. It is thus possible to embody the layers for setting the resultant point in color space depending on the viewing angle ALPHA. In particular, the color correction layer 48 can be embodied as a layer stack having a multiplicity of layers 50, 51, 52, 53, 54, 55, 56 (FIG. 9).

The antireflection layer 58 and the color correction layer 48 are arranged on the two mutually oppositely arranged surfaces 68, 70 of the second section 66 of the covering element 62. The second section 66 of the covering element 62 can thus serve to accommodate both the antireflection layer 58 and the color correction layer 48.

This disclosure is not restricted to the examples described herein. Rather, the disclosure encompasses any new feature and also any combination of features, which in particular comprises any combination of features in the claims, even if this feature or this combination itself is not explicitly specified in the claims or examples.

The invention claimed is:

1. A radiation-emitting component comprising:
   a semiconductor layer stack having an active region that emits electromagnetic radiation, and
   at least one surface of the semiconductor layer stack or of an optical element that transmits the electromagnetic radiation wherein the surface has a normal vector, wherein
   on the at least one surface of the semiconductor layer stack or of the optical element through which the electromagnetic radiation passes, an antireflection layer is arranged such that, for a predetermined wavelength, it has a minimum reflection at a viewing angle relative to the normal vector of the surface of 30° to 60°.

2. The radiation-emitting component according to claim 1, further comprising a substrate on which the semiconductor layer stack is arranged, and which has a surface remote from the semiconductor layer stack and on which the antireflection layer is arranged.

3. The radiation-emitting component according to claim 2, wherein the substrate comprises at least one material selected from the group consisting of glass, quartz and plastic.

4. The radiation-emitting component according to claim 1, further comprising a cover plate spaced apart from the semiconductor layer stack, wherein the cover plate has a surface facing the semiconductor layer stack and a surface remote from the semiconductor layer stack and the antireflection layer is arranged on at least one of the surfaces of the cover plate.

* * * * *